US008446562B2

(12) United States Patent
Meehan et al.

(10) Patent No.: US 8,446,562 B2
(45) Date of Patent: May 21, 2013

(54) ACTUATOR SYSTEM USING MULTIPLE PIEZOELECTRIC ACTUATORS

(75) Inventors: Michael F. Meehan, Southbury, CT (US); Fred Joseph Scipione, Bethel, CT (US)

(73) Assignee: ASML Holding N.V., Veldhoven (NL)

( * ) Notice: Subject to any disclaimer, the term of this patent is extended or adjusted under 35 U.S.C. 154(b) by 743 days.

(21) Appl. No.: 12/508,899

(22) Filed: Jul. 24, 2009

(65) Prior Publication Data

US 2010/0026976 A1    Feb. 4, 2010

Related U.S. Application Data

(60) Provisional application No. 61/084,772, filed on Jul. 30, 2008.

(51) Int. Cl.
   *G03B 27/42*    (2006.01)
(52) U.S. Cl.
   USPC .............. 355/53; 355/63; 355/67; 355/72; 355/77
(58) Field of Classification Search
   USPC .............. 355/53, 67; 359/811, 813, 819, 822, 359/823, 824; 310/323.06, 323.09
   See application file for complete search history.

(56) References Cited

U.S. PATENT DOCUMENTS

| 2005/0213060 | A1* | 9/2005 | Duisters et al. ................. 355/30 |
| 2005/0242686 | A1* | 11/2005 | Yamamoto et al. ...... 310/323.02 |
| 2007/0047876 | A1* | 3/2007 | Kwan et al. ..................... 385/52 |
| 2008/0211348 | A1* | 9/2008 | Wischnewskij et al. . 310/323.02 |

FOREIGN PATENT DOCUMENTS

JP    2005-175271 A    6/2005

OTHER PUBLICATIONS

English-Language Translation of Notification of Reason(s) for Refusal directed to related Japanese Patent Application No. 2009-171820, mailed Sep. 27, 2011, from the Japanese Patent Office; 3 pages.

* cited by examiner

*Primary Examiner* — Hung Henry Nguyen
*Assistant Examiner* — Mesfin T Asfaw
(74) *Attorney, Agent, or Firm* — Sterne, Kessler, Goldstein & Fox P.L.L.C.

(57) ABSTRACT

A positioning system adjusts a position of an optical element within an optical device, such as a variable-zoom lens system. A frame supports the optical element, and an elongated surface of each of one or more elongated support structures supports the frame. The frame also supports one or more piezoelectric actuators that, respectively, engage one of the elongated support structures. A controller supplies a control signal to activate each of the one or more actuator modules. Upon activation, a piezoelectric element of each of the activated actuator modules applies a combination of a first force and a second force to an elongated surface of the respective elongated support structures to position the frame along the elongated surface. The combination of forces applied by the piezoelectric element advances the piezoelectric actuator module along the elongated support structure.

22 Claims, 9 Drawing Sheets

ACTUATOR SYSTEM USING MULTIPLE PIEZOELECTRIC ACTUATORS

CROSS REFERENCE TO RELATED APPLICATIONS

This application claims benefit under 35 U.S.C. §119(e) to U.S. Provisional Patent Application No. 61/084,772, filed Jul. 30, 2008, which is incorporated by reference herein in its entirety.

BACKGROUND

1. Field of the Invention

The present invention relates to systems for positioning optical elements within a lithographic apparatus.

2. Background Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, light is directed to a patterning device, which can be referred to as a mask, a reticle, an array of individually programmable or controllable elements (maskless), or the like. The patterning device can be used to generate a circuit pattern corresponding to an individual layer of an IC, flat panel display, or other device. This pattern can be transferred onto all or part of the substrate (e.g., a glass plate, a wafer, etc.), by imaging onto a layer of radiation-sensitive material (e.g., resist) provided on the substrate. The imaging can include the processing of light through the like. Other components or devices can exist in a lithographic apparatus, such as a projection system, which can include optical components such as mirrors, lenses, beam splitters, and that can also contain optical components, such as a multi-field relay (MFR), which contains optical components to divide a radiation beam into a number of individual beams prior to patterning.

Projection systems, such as those commonly incorporated into a lithographic apparatus, often include telescoping, variable zoom lens assemblies. In such assemblies, one or more densely-packed lens elements (and other optical elements) must be positioned accurately and reliably within a confined housing. In existing variable zoom lens assemblies, such positioning is generally performed using a slide mechanism coupled to one or more actuators. For example, a lens element within the variable zoom lens assembly can be supported within a housing and positioned along a slider using a single mechanical actuator.

However, the accuracy with which a lens element can be positioned in such assemblies is degraded by the friction, stiction, and low or variable stiffness that are characteristic of existing slide assemblies. Further, such friction, stiction, and low or variable stiffness affects even high-quality slides that employ low-friction materials, ball or roller bearings, or fluid bearings. Similar deficiencies are present in existing mechanical actuators that are coupled to these slide mechanisms, such as plain screws or roller or ball screws. Frictionless bearings, such as fluid bearings or magnetic levitation bearings, also tend to provide low stiffness when incorporated within existing slide assemblies.

In addition, any misalignment of the slide, or any defect in the straightness of the slide, produces a corresponding variation in the lateral position of the lens element or in its tip, tilt, or rotation. The use of a single actuator per optical element, which is common in existing positioning systems, does not allow for independent adjustment or correction of a lateral orientation of the lens element, or in its tip, tilt, or rotation.

SUMMARY

Therefore, what is needed is a system that accurately and reliably positions one or more optical elements within an optical device, while maintaining relatively low levels of friction and stiction and relatively high levels of stiffness, thereby substantially obviating the drawbacks of the conventional systems.

In one embodiment, there is provided a system for positioning an optical element within an optical device. The system includes a frame configured to support the optical element and one or more elongated support structures. Each of the one or more elongated support structures includes at least one elongated surface configured to support the frame.

Further, the system includes one or more actuator modules respectively supported by the frame and configured to engage a respective one of the one or more elongated support structures. Each of the one or more actuator modules includes at least one piezoelectric element configured to (i) apply a first force to the at least one elongated surface of the respective one of the one or more elongated support structures in a direction substantially perpendicular to the at least one elongated surface and (ii) apply a second force to the at least one elongated surface of the respective one of the one or more elongated support structures in a direction substantially parallel to the at least one elongated surface. A controller is configured to supply a control signal to activate each of the one or more actuator modules, whereby the at least one piezoelectric element of each activated one of the one or more actuator modules applies a combination of the first and second forces to the at least one elongated surface of the respective one of the one or more elongated support structures to position the frame along the at least one elongated surface.

In a further embodiment, a lithographic apparatus includes a support structure configured to support a pattern device that is configured to pattern a beam of radiation from an illumination system and a projection system configured to project the patterned beam towards a substrate support configured to support a substrate. The projection system includes a system for positioning an optical element having a frame configured to support the optical element and one or more elongated support structures. Each of the one or more elongated support structures comprises at least one elongated surface configured to support the frame. Further, the system includes one or more actuator modules, such that each of the one or more actuator modules is supported by the frame and configured to engage a respective one of the one or more elongated support structures. Each of the one or more actuator modules includes at least one piezoelectric element configured to (i) apply a first force to the at least one elongated surface of the respective one of the one or more elongated support structures in a direction substantially perpendicular to the at least one elongated surface and (ii) apply a second force to the at least one elongated surface of the respective one of the one or more elongated support structures in a direction substantially parallel to the at least one elongated surface. A controller is configured to supply a control signal to activate each of the one or more actuator modules, whereby the at least one piezoelectric element of each activated one of the one or more actuator modules applies a combination of the first and second forces to the at least one elongated surface of the respective one of the one or more elongated support structures to position the frame along the at least one elongated surface.

In a further embodiment, there is provided a method for positioning an optical element within an optical device. One or more of a longitudinal position of the optical element; a lateral position of the optical element; and a rotation of the optical element are measured. In response to the measured one or more longitudinal position, lateral position, and rotation, a combination of a first force and a second force is applied to at least one elongated surface of a respective one of a plurality of elongated support structures, which are configured to support the optical element within the optical device. One or more of the longitudinal position, the lateral position, and the rotation of the optical element are adjusted using at least the applied combination of the first force and the second force.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1A and 1B schematically depict a lithographic apparatus, according to embodiments of the present invention.

Figure 3:
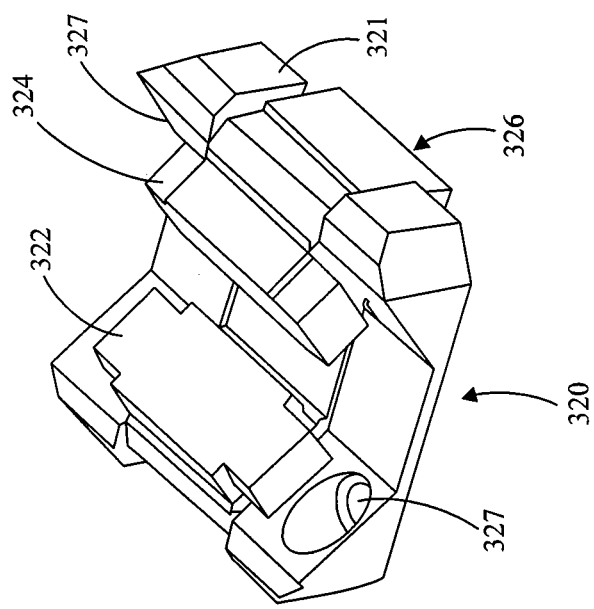
FIG. 3 is a perspective view of a piezoelectric actuator that may be incorporated into the exemplary system of FIG. 2, according to according to an embodiment of the present invention.

FIGS. 4A-4E schematically depicts features of the operation of the piezoelectric actuator module of FIG. 3, according to an embodiment of the present invention.

Figure 5:
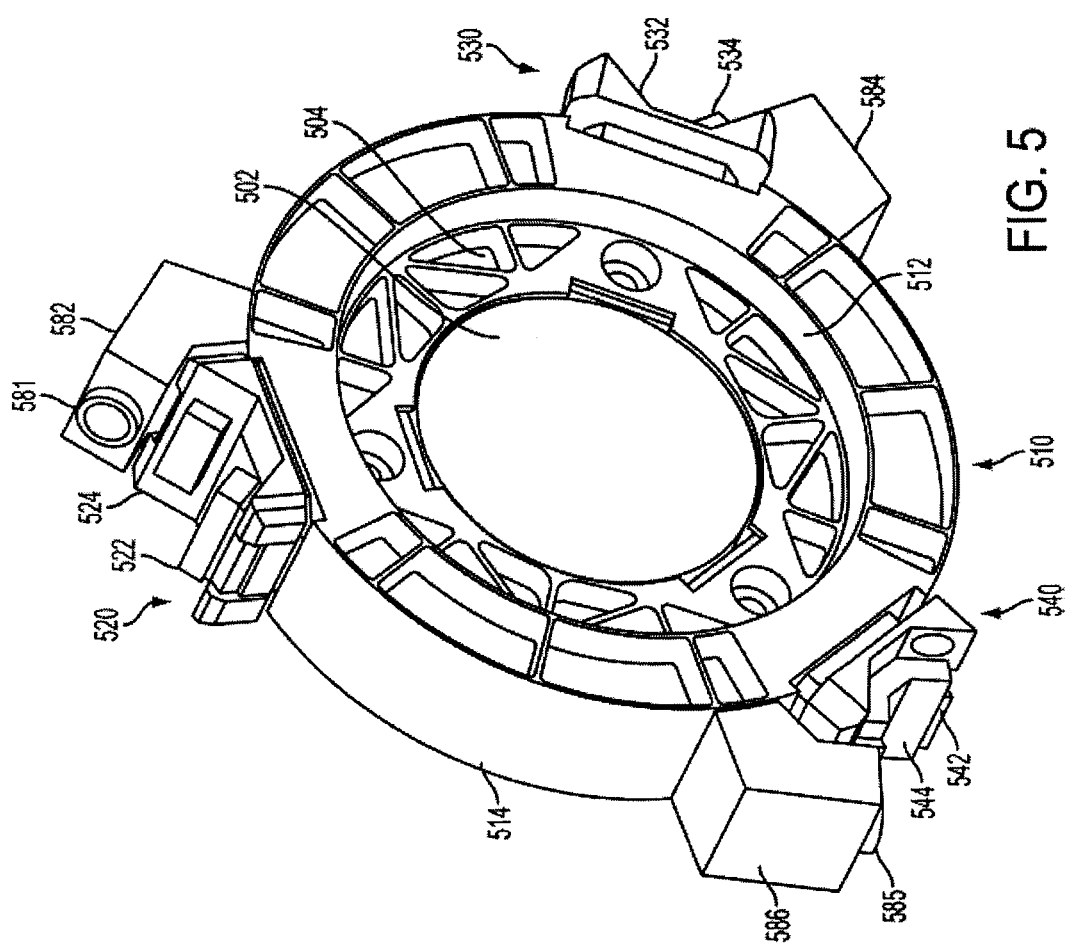

FIG. 5 is a perspective view of a carrier frame, according to an embodiment of the present invention.

Figure 6:
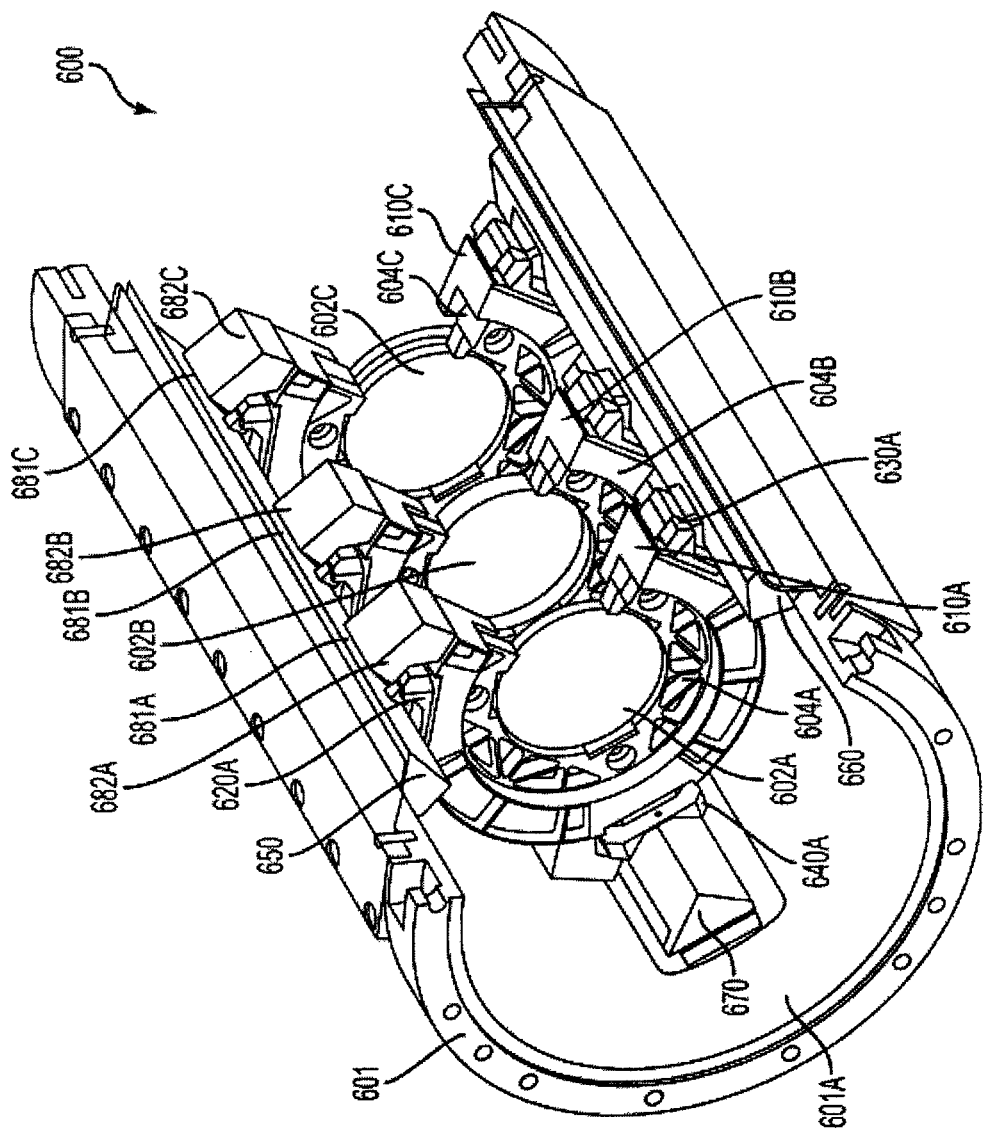

FIG. 6 is a cut-away view of an optical device, according to an embodiment of the present invention.

Figure 7:
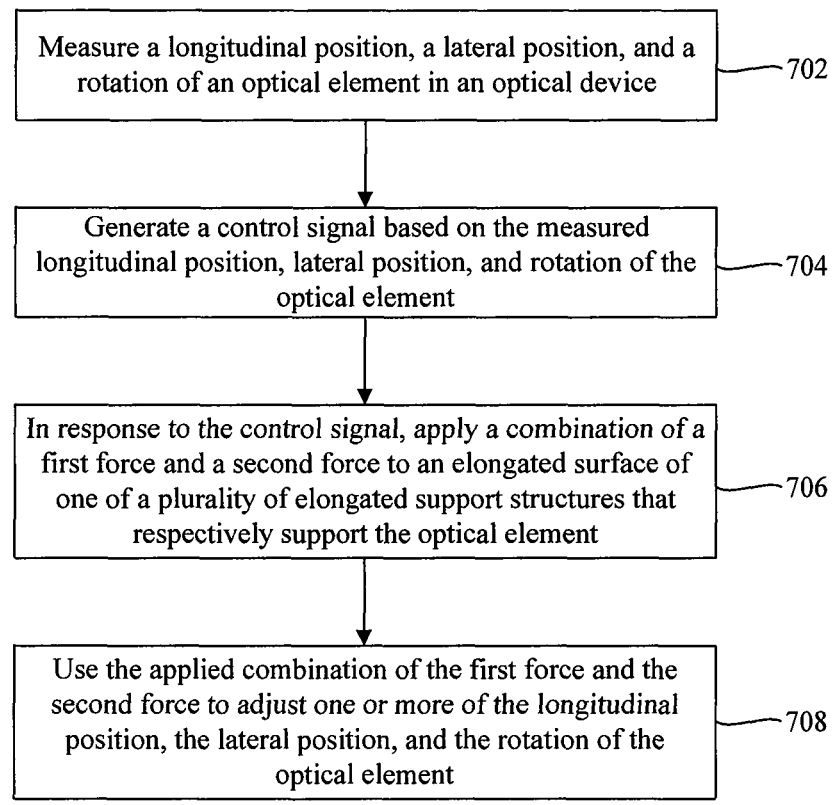

FIG. 7 is a flowchart of an exemplary method for positioning an optical element within an optical device, according to an embodiment of the present invention.

One or more embodiments of the present invention will now be described with reference to the accompanying drawings. In the drawings, like reference numbers can indicate identical or functionally similar elements.

DETAILED DESCRIPTION OF THE INVENTION

This specification discloses one or more embodiments that incorporate the features of this invention. The disclosed embodiment(s) merely exemplify the invention.

The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1A:
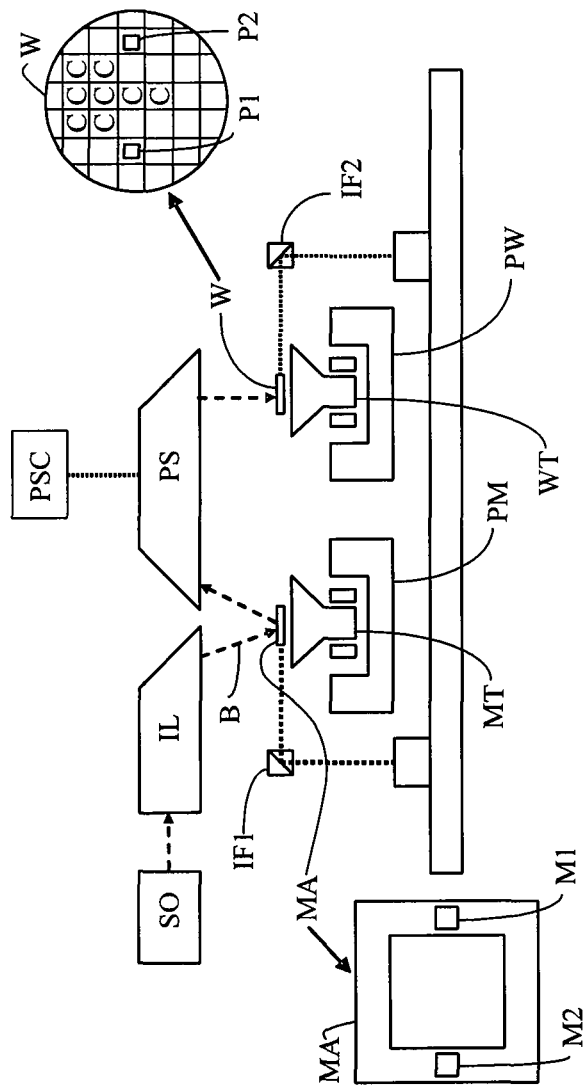

FIG. 1A schematically depicts a lithographic apparatus 1 according to one embodiment of the invention. The apparatus 1 includes an illumination system (illuminator) IL configured to condition a radiation beam B (e.g., UV radiation or EUV radiation). A support MT (e.g., a mask table) is configured to support a patterning device MA (e.g., a mask) and is connected to a first positioner PM that is configured to accurately position the patterning device in accordance with certain parameters. A substrate table WT (e.g., a wafer table) is configured to hold a substrate W (e.g., a resist-coated wafer) and is connected to a second positioner PW that is configured to accurately position the substrate in accordance with certain parameters. A projection system PS (e.g., a refractive projection lens system) is configured to project a pattern imparted to the radiation beam B by patterning device MA onto a target portion C (e.g., comprising one or more dies) of the substrate W.

In an embodiment, projection system PS can include one or more additional optical devices configured to condition radiation beam B. In such an embodiment, a projection system controller PSC can provide control signals to the one or more additional optical devices positioned within projection system PS, or alternatively, within any other optical system of lithographic apparatus 1. For example, projection system PS may include a variable-zoom lens assembly that houses one or more densely-packed lens elements. In such an example, projection system controller PSC can provide control signals to one ore more actuators to adjust a position of one or more of the densely-packed lens elements within the assembly.

The illumination system may comprise various types of optical components, including, but not limited to, refractive, reflective, magnetic, electromagnetic, electrostatic or other types of optical components, or any combination thereof, to direct, shape, or control radiation.

Support MT bears the weight of the patterning device. Further, support MT holds the patterning device in a manner that depends on the orientation of the patterning device, the design of the lithographic apparatus, and other conditions, such as, for example, whether or not the patterning device is held in a vacuum environment. Support MT can use mechanical, vacuum, electrostatic or other clamping techniques to hold the patterning device. Support MT can be a frame or a table, for example, which may be fixed or movable as required. Support MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern comprises phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include, but are not limited to, masks, programmable mirror arrays, and programmable LCD panels. Masks are well known in lithography, and include binary, alternating phase-shift, and attenuated phase-shift masks, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including, but not limited to, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As herein depicted, apparatus 1 is of a reflective type (e.g., employing a reflective mask). Alternatively, apparatus 1 may be of a transmissive type (e.g., employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate is covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1A, the illuminator IL receives radiation from a radiation source SO. The source and the lithographic apparatus may be separate entities, for example, when the source is an excimer laser. In such cases, the source is not considered to form part of the lithographic apparatus and the radiation is passed from the source SO to the illuminator IL with the aid of a beam delivery system that, for example, includes suitable directing mirrors and/or a beam expander. In additional embodiments, the source may be an integral part of the lithographic apparatus, for example when the source is a mercury lamp. The source SO and the illuminator IL, together with the beam delivery system BD, if present, may be referred to as a "radiation system."

In an embodiment, the illuminator IL may comprise an adjuster configured to adjust the angular intensity distribution in a pupil plane of the radiation beam. Generally, at least the outer and/or inner radial extent (commonly referred to as $\sigma_{outer}$ and $\sigma_{inner}$, respectively) of the intensity distribution in a pupil plane of the illuminator can be adjusted. In addition, the illuminator IL may include various other components, such as an integrator and a condenser. In such embodiments, the illuminator may be used to condition the radiation beam, to have a desired uniformity and intensity distribution in its cross-section.

The radiation beam B is incident on the patterning device (e.g., mask MA) that is held on the support (e.g., mask table MT) and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 (e.g., an interferometric device, linear encoder or capacitive sensor) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1 and M2 and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a further embodiment, lithographic apparatus 1 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

Figure 1B:
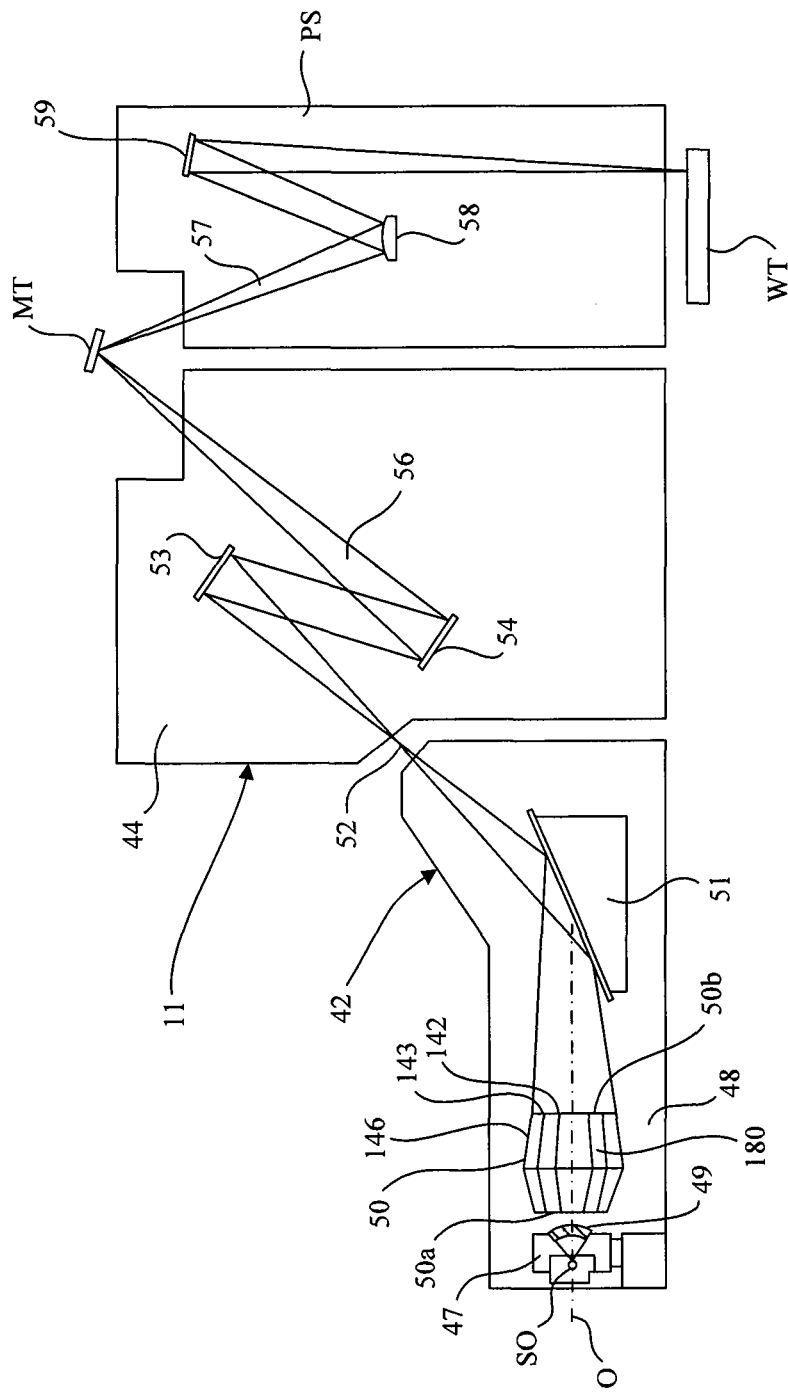

FIG. 1B schematically depicts an exemplary EUV lithographic apparatus according to an embodiment of the present invention. In FIG. 1B, a projection apparatus 1 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector.

Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 1B. For example, grating spectral filter 51 may optionally be present, depending upon the type of lithographic apparatus. Further, in an embodiment, illumination optics unit 44 and projection system PS may include more mirrors than those depicted in FIG. 1B. For example, projection system PS may incorporate one to four reflective elements in addition to reflective elements 58 and 59.

In FIG. 1B, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 1B, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 1B, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. In FIG. 1B, the beam of radiation B passes through lithographic apparatus 1. Following the light path that beam of radiation B traverses through lithographic apparatus 1, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 1B (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 1B, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146.

Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm) and extreme ultra-violet (EUV or soft X-ray) radiation (e.g., having a wavelength in the range of 5-20 nm, e.g., 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

Figure 2:
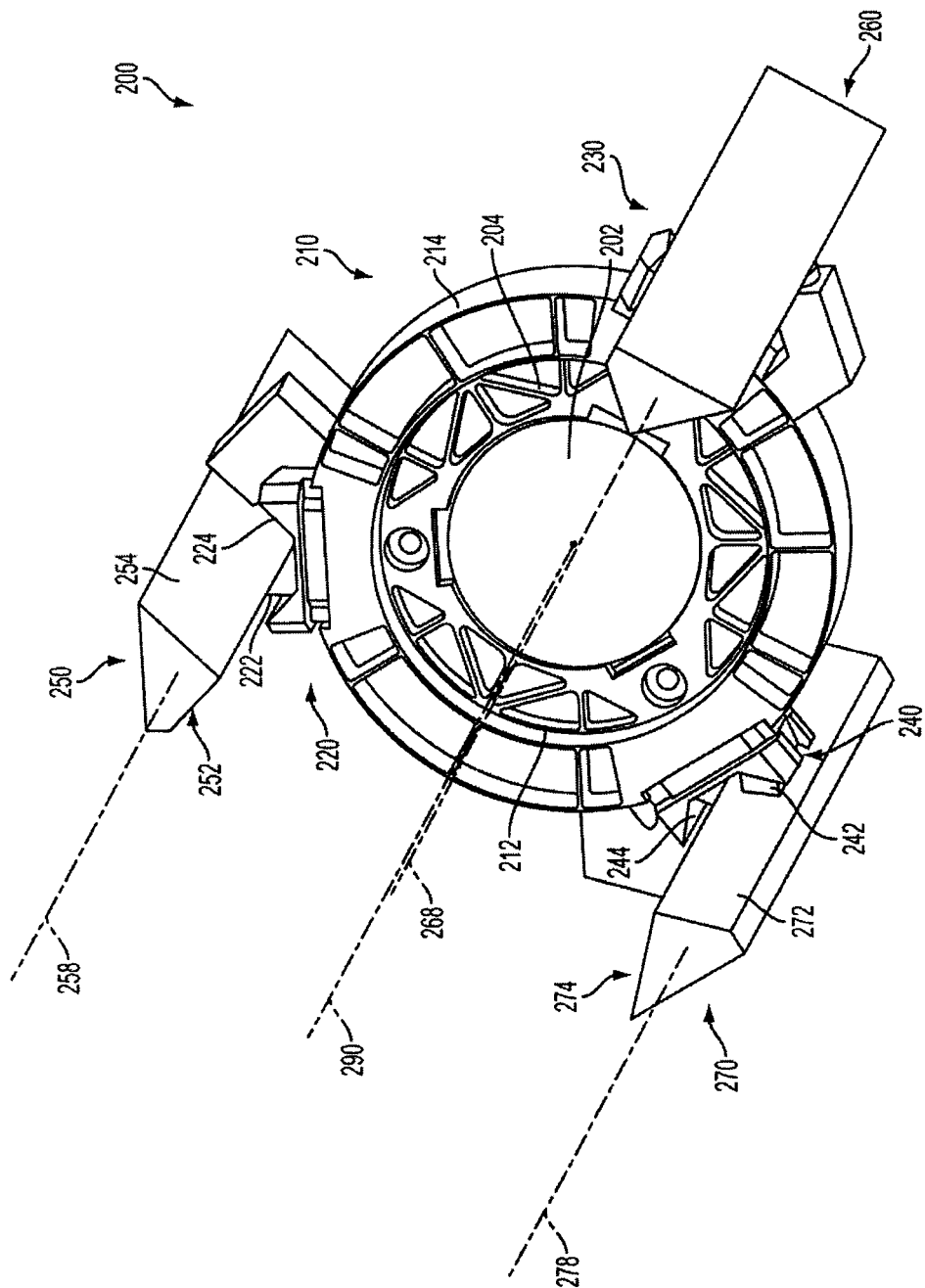
FIG. 2 is a perspective view of an exemplary system for positioning an optical element within an optical device, according to an embodiment of the present invention.

FIG. 2 is a perspective view of a portion of an exemplary system 200 for positioning an optical element 202 within an optical device, according to an embodiment of the present invention. In FIG. 2, an optical element 202, including, but not limited to, a lens element and a reflective element, is housed within an optical housing 204. For example, system 200 may position a zoom lens element within a variable-zoom lens assembly of a lithographic apparatus. However, the present invention is not limited to such optical elements, and in additional embodiments, optical element 202 can include any of a variety of optical elements, optical devices, and opto-mechanical devices that would be apparent to one skilled in the art.

In the example shown in FIG. 2, an annular carrier frame 210 has an inner surface 212 and outer frame surface 214. Inner surface 212 of carrier frame 210 is configured to support optical housing 204, and therefore, to support optical element 202. In an embodiment, optical housing 204 can be secured to inner frame surface 212 using any of a number of techniques appropriate to housing 204 and optical element 202, as would be apparent to one skilled in the art.

Optical housing 204 and optical element 202 can form a modular unit that is detachable from carrier frame 210. However, the present invention is not limited to modularly-constructed optical elements and housings, and in additional embodiments, optical element 202 and optical housing 204 may be permanently fixed to inner frame surface 212 of carrier frame 210 using any number of appropriate techniques, as would be apparent to one skilled in the art. Further, in an embodiment, optical element 202 can be secured directly to inner surface 212 of carrier frame 210, thereby eliminating optical housing 204.

As depicted in the example shown in FIG. 2, three elongated support structures, shown respectively at 250, 260, and 270, are positioned proximate to outer surface 214 to support carrier frame 210, and therefore, to support both optical housing 204 and optical element 202. Elongated support structures 250, 260, and 270 have respective elongated axes 258, 268, and 278, and in the embodiment of FIG. 2, elongated support structures 250, 260, and 270 are arranged such that these respective elongated axes are substantially mutually parallel. Further, in FIG. 2, elongated support structures 250, 260, and 270 are arranged such that respective elongated axes 258, 268, and 278 are also mutually parallel with an optical axis 290 of optical element 202. In an embodiment, optical axis 290 of optical element 202 may coincide with an optical axis (not shown) of the optical device.

Further, in an embodiment, elongated support structures 250, 260, and 270, respectively, are elongated, prismatic structures having substantially-triangular cross sections. As such, elongated support structures 250, 260, and 270 respectively include at least three substantially-flat elongated surfaces. For example, elongated support structure 250 includes elongated surfaces 252, 254, and 256; elongated support structure 260 includes elongated surfaces 262, 264, and 266; and elongated support structure 270 includes elongated surfaces 272, 274, and 276. In an embodiment, elongated support structures 250, 260, and 270 can be constructed from any of a number of resilient materials, including, but not limited to, glasses, ceramics, metal, and composite materials.

As described above, existing systems that position optical elements in an optical device, such as those that position one or more lens elements in a variable-zoom lens assembly, generally support an optical element using a slide assembly driven by a single, mechanical actuator. However, the accuracy with which an optical element can be positioned in such devices is degraded by the friction, stiction, and low or variable stiffness that are characteristic of existing slide assemblies. Further, as such systems generally position an optical element using a single actuator, these systems are unable to independently adjust or correct either a lateral orientation or a rotation of the optical element.

In contrast to these existing systems, system 200 positions carrier frame 210 along elongated support structures 250, 260, and 270 using a set of piezoelectric actuator modules 220, 230, and 240 that respectively engage a corresponding one of the elongated support structures 250, 260, and 270 in response to a control signal provided by a control module, such as projection system controller PSC of FIG. 1A.

Piezoelectric actuators, which incorporate individual piezoelectric elements as well as stacked piezoelectric elements, can provide accurate and repeatable activation while exhibiting relatively low power dissipation in a stationary configuration. Further, piezoelectric actuators are attractive for use within a vacuum environment, as these actuators produce negligible level of out-gassed solid and hydrocarbon particles and other contaminants.

For example, upon activation, piezoelectric actuator modules 220, 230, and 240 respectively engage elongated support structures 250, 260, and 270 to position carrier frame 210 along the elongated support structures 250, 260, and 270 in a direction parallel to optical axis 290. In further contrast to existing positioning systems, piezoelectric actuator modules 220, 230, and 240 allow for an independent adjustment of a position of carrier frame 210 in a lateral direction (e.g., a direction perpendicular to optical axis 290) and further, independent control of tilting and rotation of carrier frame 210.

In the example shown in FIG. 2, piezoelectric actuator modules 220, 230, and 240 are respectively positioned along the outer frame surface 214 of carrier frame 210. In such an embodiment, relative motion between carrier frame 210 and the respective piezoelectric actuator modules is substantially eliminated during motion of carrier frame 210 along the elongated support structures.

Further, in the example shown in FIG. 2, piezoelectric actuator modules 220, 230, and 240 are positioned about outer surface 214 of carrier frame 210 at 120° intervals to engage, respectively, similarly-positioned elongated support structures 250, 260, and 270. However, in additional embodiments, piezoelectric actuator modules 220, 230, and 240 may be positioned at any location along outer surface 214 that allows each piezoelectric actuator module to engage a respective one of the elongated support structures.

Piezoelectric actuator modules 220, 230, and 240 each include a first piezoelectric element that engages a first surface of a respective elongated support structure 250, 260, and 270 and a second piezoelectric element that engages a second surface of the respective elongated support structure. For example, and as depicted in the example shown in FIG. 2, piezoelectric actuator module 220 includes a first piezoelectric element 222 that engages a first surface 252 of elongated support structure 250 and a second piezoelectric element 224 that engages a second surface 254 of elongated support structure 250. Further, for example, piezoelectric actuator module 240 includes a first piezoelectric element 242 that engages a first surface 272 of elongated support structure 270 and a second piezoelectric element 244 that engages a second surface 274 of elongated support structure 270. Although not depicted in FIG. 2, a similar set of piezoelectric elements within piezoelectric actuator 230 engages a first surface 262 and a second surface 264 of elongated support structure 260.

Piezoelectric actuator modules 220, 230, and 240 can be activated individually or collectively in response to a control signal from a control module, such as projection system controller PSC of FIG. 1A. The respective piezoelectric elements of each activated piezoelectric actuator module (e.g., first piezoelectric element 222 and second piezoelectric element 224 of activated piezoelectric module 220) then each apply a respective force to a corresponding elongated surface of an elongated support structure. For example, upon receipt of the control signal, first piezoelectric element 222 applies a combination of a first force and a second force to elongated surface 252 of elongated support structure 250, and second piezoelectric element 224 applies a combination of a first force and a second force to elongated surface 254 of elongated support structure 250. In an embodiment, each first force is substantially perpendicular to the elongated surface (e.g., the force acts normal to the elongated surface), and each second force is substantially parallel to the elongated surface (e.g., the force acts tangentially to the elongated surface).

In an embodiment, each of the pair of piezoelectric elements associated with each piezoelectric actuator module (e.g., piezoelectric elements 222 and 224 associated with module 220) includes two independent piezoelectric pieces, or alternatively, two independent sets of piezoelectric pieces. These two independent piezoelectric pieces, or two independent sets of piezoelectric pieces, can, in response to the control signal, cyclically apply a combination of the first and second forces to a corresponding elongated surface of an elongated support structure. The cyclical application of the first and the second forces by each of the piezoelectric pieces can collectively advance the piezoelectric actuator module along the elongated support structure. In such an embodiment, the piezoelectric actuator module would "creep" or "inch" along the elongated support structure in a manner that substantially reduces or eliminates the stiction, friction, and variable stiffness characteristic of existing actuator and slider assemblies. As piezoelectric elements 222 and 224 are positioned opposite different surfaces of the corresponding support structure (i.e., surfaces 252 and 254 of support structure 250), an application of a first force by each element can result in a lateral motion of the actuator about these opposite surfaces (e.g., motion in a plane mutually perpendicular to these surfaces).

FIG. 3 depicts a piezoelectric actuator 320 that may be incorporated into the exemplary system of FIG. 2, according to according to an embodiment of the present invention. In FIG. 3, piezoelectric actuator module 320 includes a unitary module block 321 that supports a first piezoelectric element 322 and a second piezoelectric element 324. First piezoelectric element 322 and second piezoelectric element 324 are configured, respectively, to engage an elongated surface of an elongated support structure (not shown), such as surfaces 252 and 254 of elongated support structure 250 of FIG. 2. Further, block 321 also includes a module, shown generally at 326, which transmits a received control signal to the respective first and second piezoelectric elements 322 and 324.

Block 321 can be constructed from any of a number of electrically- and optically-inert materials, including, but not limited, graphite, ceramic materials, glass, or any additional appropriate material. Further, block 321 can be attached to a surface of a carrier frame (e.g., outer surface 214 of carrier frame 210 in FIG. 2) using attachment points 327 formed into block 321. In such an embodiment, block 321 can be attached to the carrier frame using any of a variety of attachment techniques, including, but not limited to, adhering materials, bolting, machine screws, rivets, welding, and soldering.

In an embodiment, first and second piezoelectric elements 322 and 324 can be constructed from multiple piezo-electric components arranged into a "stack." Additionally, or alternatively, first and second piezoelectric elements 322 and 324 can include several such stacks operating in tandem, thereby producing a sectioned structure having several portions that can respectively act independently, or semi-independently, in response to a received control signal.

As described above, exemplary piezoelectric actuator module 320 is capable of generating a creeping or inching motion along an elongated support structure in response to a control signal. Upon receipt of that control signal, first piezoelectric element 322 and second piezoelectric element 324, respectively, each activate and apply a cyclic combination of first and second forces to the respective surfaces of the elongated support structure, as described above in reference to FIG. 2, thereby advancing module 320 along the elongated support structure. In an embodiment, each of elements 322 and 324 can independently apply a first force to a respective surface of the elongated support structure, thereby producing an independent lateral motion of module 320.

Figure 4A:
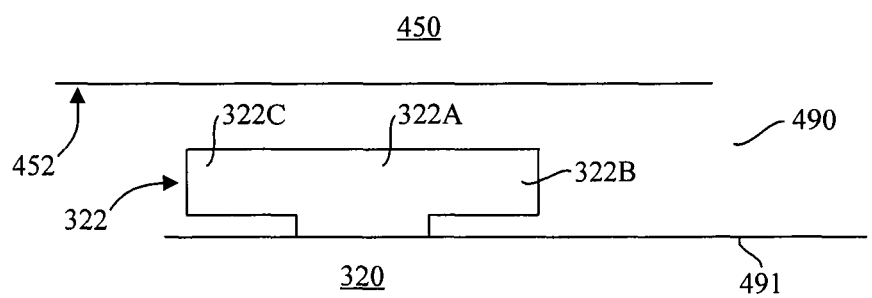

FIGS. 4A-4E schematically depict a process through which the piezoelectric actuator module 320 of FIG. 3 advances along an elongated support structure 450, according to an embodiment of the present invention. FIG. 4A schematically depicts a first piezoelectric element 322 of actuator module 320 prior to receipt of the control signal. In an embodiment, first piezoelectric element 322 includes a portion 322A that is fixed to module 320 and portions 322B and 322B that are respectively positioned adjacent to portion 322A and are not fixed to module 320. Although not depicted in FIGS. 4A-4E, second piezoelectric element 324, or any additional piezoelectric element of an additional module, could cyclically apply the forces described in FIGS. 4A-4E to a corresponding elongated surface of an elongated support structure.

In an embodiment, portions 322A, 322B, and 322C of first piezoelectric element 322 are each capable of extension towards an elongated surface 452 of an elongated support structure 450 (e.g., elongated surface 252 of a elongated support structure 250 of FIG. 2). Such an extension establishes frictional contact between the respective one of portions 322A, 322B, and 322C and surface 452, thereby applying a force in a direction substantially perpendicular to surface 452 (e.g., a normal force). In a similar fashion, respective portions 322A, 322B, and 322C are also capable of retracting away from surface 452, thereby releasing the first force. However, in contrast to portion 322A, portions 322B and 322C are also capable of extension and retraction along elongated surface 452 in a direction substantially parallel to surface 452, thereby facilitating the application of a second force substantially parallel to surface 452 (e.g., a tangential force).

Figure 4B:
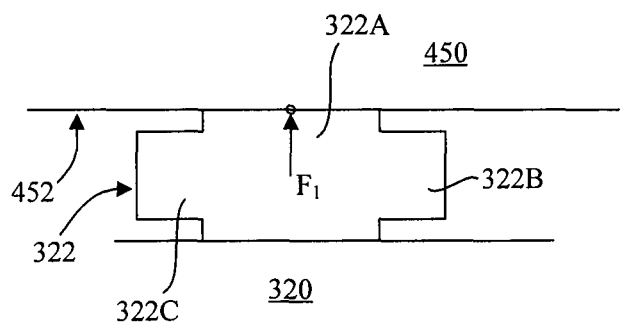
Figure 4C:
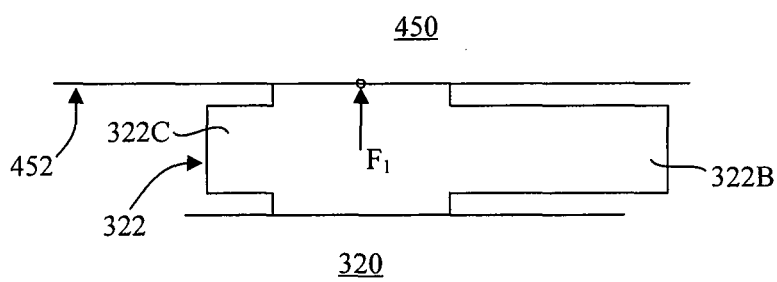
Figure 4D:
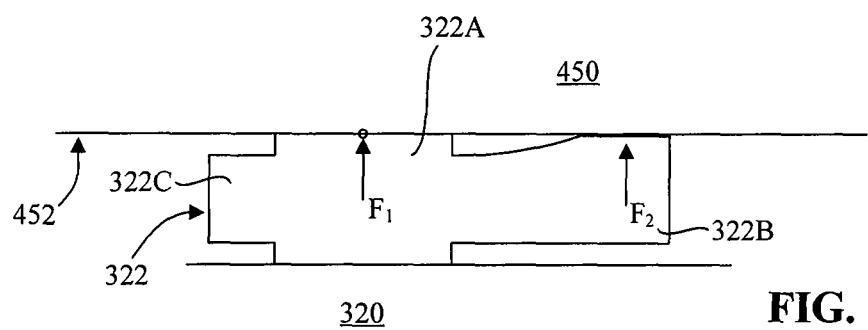

Upon receipt of the control signal, portion 322A of first piezoelectric element 322 extends towards elongated surface 452 and contacts surface 452, thereby applying a first force $F_1$ substantially perpendicular to surface 452, as depicted in FIG. 4B. While portion 322A applies the first force, portion 322B of first piezoelectric element 322 (or alternatively, portion 322C) extends in a direction parallel to surface 452, as depicted in FIG. 4C. Upon completion of the extension process, portion 322B then bends towards surface 452 and contacts surface 452, thereby applying an additional force $F_2$ substantially perpendicular to surface 452, as depicted in FIG. 4D. Therefore, portions 322A and 322B have exerted respective forces $F_1$ and $F_2$ that are substantially perpendicular to the corresponding elongated surface, thus clamping first piezoelectric element 322 to surface 452.

Figure 4E:
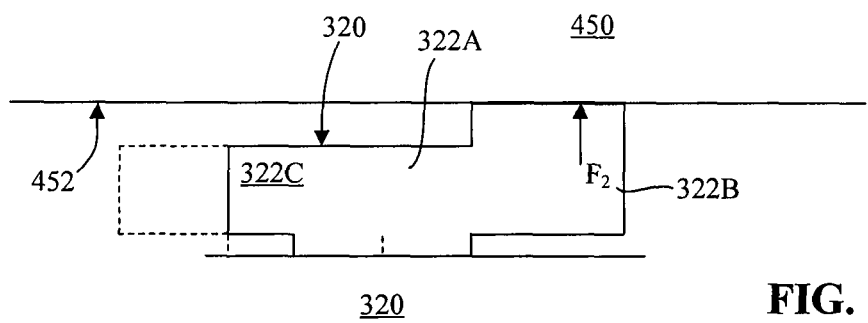

In FIG. 4E, portion 322A retracts from surface 452, thereby releasing force $F_1$, while portion 322B maintains the application of force $F_2$. Further, as portion 322B retracts in the direction parallel to surface 452, now-released portion 322A, and module 320 to which it is attached, are drawn towards the still-clamped portion 322B. As portion 322A is fixed to actuator module 320, the retraction of portion 322B advances actuator module 322B in the direction parallel to surface 452 towards clamped portion 322B. Once the motion of actuator module 320 along surface 452 is complete, and a single cycle of creeping motion is completed.

In additional embodiments, one ore more cycles of creeping motion can be performed by piezoelectric element 322 (or any other piezoelectric element) to advance piezoelectric actuator module 320 along elongated support structure 450 Further, although not depicted in FIGS. 4A-4E, second piezoelectric element 324 of piezoelectric actuator module 320 could perform the cyclical process outlined in FIGS. 4A-4E in conjunction with first piezoelectric element 322, thereby cooperatively advancing actuator module 320 along the corresponding surface of an elongated support structure.

Referring back to the example shown in FIG. 2, the cyclical process described in FIGS. 4A-4E could be performed by each piezoelectric element of an activated piezoelectric actuator module (e.g., piezoelectric actuator modules 220, 230, and 240) to advance the activated piezoelectric actuator module along a corresponding elongated support structure. In an embodiment, piezoelectric actuator modules 220, 230, and 240 can be activated, respectively, by a single control signal provided by the control module (e.g., projection system controller PSC of FIG. 1A) and can traverse, respectively, elongated support structures 250, 260, and 270 at a constant rate of speed, thereby positioning carrier frame 210 along the elongated support structures without inducing any tilt or rotation.

However, in an additional embodiment, one or more piezoelectric actuator modules within positioning system 200 may receive a control signal that differs from a control signal received by one or more additional piezoelectric actuator modules within positioning system 200. For example, in response to a control signal from the control module, piezoelectric actuator modules 220 and 230 may respectively advance along elongated support structures 250 and 260, while piezoelectric actuator module 240 may remain stationary. In such an embodiment, the resulting motion of piezoelectric actuator modules 220 and 230 tilts carrier frame 210 and optical element 202, e.g., to bias optical element 202 against an additional optical element (not shown).

In an embodiment, the positioning of two piezoelectric actuator modules (e.g., any two of actuator modules 220, 230, and 240 of FIG. 2) along outer surface 214 of carrier frame 210 provides sufficient tangential (or elastic) compliance to ensure kinematic contact between the piezoelectric elements of each piezoelectric actuator module and the corresponding elongated surfaces of the elongated support structures (e.g., elongated support structures 250, 260, and 270 of FIG. 2). Further, to ensure radial compliance, the piezoelectric elements associated with one of the piezoelectric actuator modules depicted in FIG. 2 can be preloaded with a corresponding pre-load force. In such an embodiment, each piezoelectric actuator module also possesses sufficient compliance in tip, tilt, and rotation to insure even contact with elongated surfaces of the corresponding elongated support structures.

In an embodiment, the elongated support structures and corresponding elongated surfaces are manufactured and positioned with sufficient precision to incorporate the necessary compliance for kinematic contact into the design of the respective piezoelectric modules. Alternatively or additionally, the necessary compliance for kinematic contact may emerge from the properties and operation of the piezoelectric actuator module. If piezoelectric actuator modules 220, 230, and 240 collectively and/or individually provide (elastic) tangential compliance, a rotational orientation of the cell and lens can be determined by elastic averaging (such averaging is sufficient for most applications in which rotational loads and rotational accuracy requirements are both low).

In an embodiment, the respective piezoelectric actuator modules depicted in FIG. 2 can remained engaged to a corresponding elongated support structures in the absence of a control signal. In such an embodiment, the resulting frictional forces maintain the position, tip, tilt, and rotation of carrier frame 210 and optical element 202, and as such, any drift over time of position and orientation in such an embodiment will be minimal. Small variations of position and orientation can be created or compensated for under such conditions using the lateral actuation capabilities of the piezoelectric elements within each piezoelectric actuator module.

FIG. 5 is a perspective view of a carrier frame 510, according to an embodiment of the present invention. In FIG. 5, an optical 502 is housed within an optical housing 504, and optical housing 504 and optimal element 502 are collectively supported by an inner surface 512 of an carrier frame 510. Optical housing 504 can be secured to inner frame surface 512 using any of a number of techniques appropriate to the material and apparent to one skilled in the art.

In an embodiment, optical housing 504 and optical element 502 can form a modular unit that is detachable from carrier frame 510. However, the present invention is not limited to modularly-constructed optical elements and housings, and in additional embodiments, optical element 502 and optical housing 504 may be permanently fixed to inner frame surface 512 of carrier frame 510 using any number of appropriate techniques, as would be apparent to one skilled in the art.

Similar to the embodiment of FIG. 2, an outer surface 514 of carrier frame 510 supports piezoelectric actuator modules 520, 530, and 540 that can engage, respectively, a corresponding elongated support structure (not shown). In the embodiment of FIG. 5. piezoelectric actuator modules 520, 530, and 540 are positioned about outer frame surface 514 of carrier frame 510 at 120° intervals to engage to the corresponding elongated support structures. However, in additional embodiments, piezoelectric actuator modules 520, 530, and 540 may be positioned at any point along outer surface 514 of carrier frame 510 that enables each piezoelectric actuator module to engage a corresponding one of the elongated support structures.

As described above, piezoelectric actuator modules 520, 530, and 540 respectively include a first piezoelectric element that engages a first surface of a corresponding elongated support structure and a second piezoelectric element configured that engages a second surface of the corresponding elongated support structure. For example, piezoelectric actuator module 520 includes a first piezoelectric element 522 and a second piezoelectric element 524 that engage, respectively, an elongated surface of a corresponding elongated support structure (not shown). Further, for example, piezoelectric actuator module 540 includes a first piezoelectric element 542 and a second piezoelectric element 544 that engage, respectively, an elongated surface of a corresponding elongated support structure (not shown). Similarly, for example, piezoelectric actuator module 530 includes a first piezoelectric element 532 and a second piezoelectric element 534 that engage, respectively, an elongated surface of a corresponding elongated support structure (not shown).

Piezoelectric actuator modules 520, 530, and 540 can be activated individually or collectively in response to a control signal from a control module, such as projection system controller PSC of FIG. 1A. The respective piezoelectric elements of each activated piezoelectric actuator module (e.g., first piezoelectric element 522 and second piezoelectric element 524) then apply a combination of forces to the corresponding elongated surface to position each activated piezoelectric actuator module along the corresponding elongated support structure. Additionally, or alternatively, further features of piezoelectric actuator modules 520, 530, and 540, as well as the piezoelectric elements associated with each piezoelectric actuator module, are described above in reference to FIGS. 2, 3, and 4A-4E.

Carrier frame 510 also supports sensor housings 582, 584, and 586 positioned, respectively, about outer surface 514 of carrier frame 510. Sensor housings 582, 584, and 586 respectively form a portion of carrier frame 510, although in additional embodiments, sensor 582, 584, and 586 can be modular units fixed to outer surface 514 of carrier frame 510 using any of a number of techniques apparent to one skilled in the art.

In the example shown in FIG. 5, sensors 581, 583, and 585 are respectively positioned with sensor housings 582, 584, and 586. In an embodiment, sensors 581, 583, and 585 are linear encoders that respectively include, but are not limited to, an absolute linear encoder and/or an incremental linear encoder. Further, the absolute or incremental linear encoder may include any combination of an optical read head configured to read an optical scale, a magnetic read head configured to read a magnetic scale, or any additional read head apparent to one skilled in the art. In additional embodiments, sensors 581, 583, and 585 can include any additional or alternate sensor without departing from the spirit or scope of the present invention.

In the example shown in FIG. 5, sensor housings 582, 584, and 586 are respectively positioned proximate to a corresponding one of piezoelectric actuator modules 520, 530, and 540. In such an embodiment, a linear encoder positioned with each sensor housing can read a scale from a surface of a corresponding elongated support structure to measure a position of the sensor housing, and thus, the carrier frame, along the surface of the corresponding support structure. For example, and referring to FIG. 2, a linear encoder (not shown) housed within sensor housing (not shown) can read a scale (not shown) positioned on surface 287 of elongated support structure 250 to determine a position of the sensor housing along surface 287. In a similar fashion, a linear encoder (not shown) positioned within another sensor housing (not shown) can read a scale (not shown) positioned on surface 289 of elongated support structure 270 to determine a position of the sensor housing along surface 289, and a linear encoder (not shown) positioned within sensor housing (not shown) can read a scale positioned on surface 288 of elongated support structure 260 to determine a position of the sensor housing along surface 288.

However, the present invention is not limited to linear encoders configured to read scales positioned on surfaces of one or more elongated support structures. In an additional embodiment, one or more linear encoders associated with carrier frame 510 (e.g., sensors or linear encoders 581, 583, and 585) can read from a scale positioned away from the elongated support structures, e.g., a glass scale positioned away from an elongated support structure. Further, the present invention is not limited to carrier frames supporting three individual sensor housings. In additional embodiments, a position of carrier frame 510 may be determined by any number of sensor modules within in a corresponding number of sensor housings positioned along outer surface 514 of carrier frame 510 without departing from the spirit or scope of the present invention.

Although not depicted in FIG. 5, measurements from one or more sensors or linear encoders 581, 583, and 585 may provide feedback to a control module associated with the positioning system, such as that described above in reference to FIG. 2. In such an embodiment, the measurements from the one or more linear encoders can provide closed-loop feedback for a position, a tilt, or a rotation of carrier frame 510 through control signals provided to one or more of piezoelectric actuator modules 520, 530, and 540.

In contrast to existing positioning systems, the embodiments described herein can combine actuators and elongated support structures into a single interface that substantially eliminates friction and stiction, while yielding a high stiffness across the actuators to the contacted surfaces. In additional, the embodiments described herein can also allow for a uniform piezoelectric actuator design, thereby reducing manufacturing costs and reducing maintenance-related down time.

Further, the exemplary positioning systems described herein can position multiple carrier frames using a common set of elongated support structures (e.g., elongated support structures 250, 260, and 270 of FIG. 2). FIG. 6 is a cut-away view of an optical device 600 in which multiple optical elements 602A, 602B, and 602C are positioned using an exemplary positioning system, according to an embodiment of the present invention. For example, the optical elements can be positioned using the positioning system of FIG. 2. In one embodiment, such an optical device 600 is a variable-zoom lens assembly that positions one or more densely-packed lens elements 602 within a confined housing 601.

In the example shown in FIG. 6, optical device 600 includes three individual optical elements, shown generally at 602A, 602A, and 602C. Optical elements 602A, 602A, and 602C are housed, respectively, in optical housings 604A, 604B, and 604C. Optical housings 604A, 604B, and 604C, and the respective optical elements 602A, 602B, and 602C housed therein, are respectively supported by carrier frames 610A, 610B, and 610C.

Carrier frames 610A, 610B, and 610C are collectively supported by a common set of elongated support structures, respectively shown at 650, 660, and 670. In the embodiment of FIG. 6, an interior 601A of a housing 601 of optical device 600 supports each of elongated support structures 650, 660, and 670, and as such, these common set of support structures leverage the stability and stiffness of housing 601.

Carrier frames 610A, 610B, and 610C are respectively positioned along the common set of elongated support structures 650, 660, and 670 by a corresponding set of piezoelectric actuator modules that engage, respectively, a corresponding one of the elongated support structures 650, 660, and 670 in response to a control signal from a control module, such as projection system controller PSC of FIG. 1A. For example, piezoelectric actuator modules 620A, 630A, and 630B respectively position carrier frame 610A along elongated support structures 650, 660, and 670 by engaging a respective one of elongated support structures 650, 660, and 670. Although not possibly clearly visible in FIG. 6, a set of piezoelectric actuator modules respectively positions carrier frames 610B and 610C along elongated support structures 650, 660, and 670 by respectively engaging a corresponding one of elongated support structures 650, 660, and 670 in response to a control signal. For example, features of the functionality and operation of piezoelectric actuator modules 620A, 630A, and 630B may be similar to similar devices described above in reference to FIGS. 2, 3, and 4A-4E.

Respective carrier frames 610A, 610B, and 610C also include one or more sensors (e.g., linear encoders) positioned within one of a corresponding set of sensor housings. For example, carrier frame 610A supports a sensor housing 682A into which a corresponding sensor 681A is positioned. Further, a sensor module 681B is positioned within a corresponding sensor housing 682B that is supported by carrier frame 610B, and a sensor module 681C is positioned within a corresponding sensor housing 682C that is supported by carrier frame 610C. In one example, features of linear encoders 681A, 681B, and 681C may be similar to similar devices described above in reference to the linear encoder of FIG. 5.

In the embodiment of FIG. 6, sensors 681A, 681B, and 681C are linear encoders that read, respectively, from a common glass scale 687 that is separate from, but positioned proximate to, elongated support structure 650. Additionally, or alternatively, although not depicted in FIG. 6, carrier frames 610A, 610B, and 610C may support, respectively, additional sensor modules configured to read from glass scales positioned proximate to, but separate from, elongated support structures 660 and 670. In an embodiment, measurements from three linear encoders associated with each respective carrier frame provide information of a position, tilt, and rotation of the respective carrier frame, which may be similar to similar features as described above in reference to FIG. 5.

Further, the information obtained from linear encoders 681A, 681B, and 681C (and other linear encoder not clearly visible in FIG. 6) respectively associated with carrier frames 610A, 610B, and 610C may provide feedback to a control module associated with the optical device (e.g., projection system controller PSC of FIG. 1A), for example this may be similar to similar features described above in reference to FIG. 2. In such an embodiment, the measurements from linear encoders 681A, 681B, and 681C can provide closed loop feedback on the position, tilt, or rotation of respective carrier frames 610A, 610B, and 610C through control signals provided to piezoelectric actuator modules associated with carrier frames 610A, 610B, and 610C.

As such, embodiments of the present invention facilitate a dense packing of optical elements and corresponding carrier frames within an optical device, coupled with closed loop feed back to control a position, tilt, and rotation of each of the densely-packed optical elements.

The embodiment of FIG. 6 is described in terms of three optical elements supported by three corresponding carrier frames. However, the present invention is not limited to such configurations, and in additional embodiments, elongated support structures 650, 660, and 670 may support any number of densely-packed optical elements as would be recognized as controllable by one skilled in the art.

Further, in the embodiments described herein, carrier frames that support optical elements have been positional along, tilted about, and rotated about three elongated support structures. In additional embodiments, such carrier frames may be supported by any plurality of elongated support structures without departing from the spirit or scope of the present invention. Further, in such embodiments, carrier frames may be positioned along, tilted about, or rotated about the plurality of elongated support structures through a corresponding plurality of piezoelectric actuator modules configured, respectively, to engage a corresponding one of the elongated support structures.

In additional embodiments, elongated support structures, such as elongated support structures 250, 260, and 270 of FIG. 2, need not have respective cross-sectional areas that are triangular or substantially triangular. In additional embodiments, such elongated support structures may possess a circular cross-section or alternatively a semi-circular cross-section that afford a corresponding piezo-electric actuator only a narrow line of contact. In a further embodiment, sets of elongated support structures may include any combination of elongated rods having triangular, substantially triangular, circular, semi-circular, or prismatic cross section without departing from the spirit or scope of the present invention. In such embodiments, piezoelectric actuators configured to engage any of such elongated structures still require both tangential and radial compliance, as described above.

In an embodiment, the elongated support structures may be elongated plates. In such an embodiment, a piezoelectric actuator module having a single piezoelectric element may engage the elongated plate, as no tangential compliance is needed at any elongated surface.

As described above, an elongated support structure may have a substantially triangular cross section, and first and second piezoelectric elements of a corresponding piezoelectric actuator module can respectively engage adjacent elongated surfaces (e.g., first and second piezoelectric elements 222 and 224 engaging, respectively, elongated surfaces 252 and 254 of elongated support structure 250 in FIG. 2). In such an embodiment, a shape of the substantially-triangular cross section of the corresponding elongated support structure can be modified to reduce a magnitude of an angle between the adjacent elongated surfaces, thereby confining higher forces within each piezoelectric module and reducing a radial component of the reaction forces transmitted to the corresponding carrier frame and optical element.

In the embodiment of FIG. 2, exemplary positioning system 200 incorporates three piezoelectric actuator elements that respectively include a pair of piezoelectric elements. However, in an additional embodiment, the three pairs of piezoelectric elements can be replaced by six piezoelectric actuator modules that respectively include a single piezoelectric element. In such an embodiment, three piezoelectric actuator modules can be supported by a carrier frame, which houses an optical element. Additionally, or alternatively, the three piezoelectric actuator modules can act, respectively, on a surface of one of a corresponding set of elongated rods having respective prismatic cross sections. In an embodiment, these prismatic elongated rods respectively pass through the carrier frame near an outer surface and are positioned respectively parallel to a direction of motion of the carrier frame, e.g., an optical axis of an optical device.

Three additional elongated plates may be positioned proximate to the outer surface of the carrier frame, such that a flat surface of each elongated plate is opposite the outer surface of the carrier frame. Additionally, or alternatively, the carrier frame can support three additional piezoelectric actuator modules that respectively include a single piezoelectric element configured to act upon the flat surface of a corresponding one of the elongated plates. In an embodiment, these additional piezoelectric actuator modules can be radially compliant with a corresponding one of the elongated plates, and can engage the corresponding elongated plate when the carrier frame is stationary.

As described above in the embodiment of FIG. 6, a common set of elongated rods and elongated plates could be used by multiple carrier frames densely packed into an optical device. In an embodiment, the elongated places could, respectively, exhibit a slight curvature and could be a portion of housing of the optical device, such as housing 602 in FIG. 6. In such an embodiment, additional mechanisms to control and/or limit the rotation of the carrier frame can be incorporated into the system.

Additionally, or alternatively, the carrier frames can support auxiliary frictionless bearings, including, but not limited to fluid (air) bearings or magnetic levitation bearings, that act against the elongated plates or the interior of the housing of the optical device. Additionally, or alternatively, the three piezoelectric actuator modules that engage the prismatic elongated rods could be replaced by one or more "linear motor" actuators or other linear actuators. In such an embodiment, the linear actuators could be used to provide coarse translation, with the radial piezo-electric actuators providing fine positioning, clamping, stationary stiffness, etc. The functions of magnetic levitation bearings and linear motors can be combined and can be provided by a common set of integrated magnetic components.

FIG. 7 is a flowchart of an exemplary method 700 for positioning an optical element within an optical system, according to an embodiment of the present invention. In step 702, measurements are made of at least one of a longitudinal position, a lateral position, and a rotation of the optical element within the optical device. In an embodiment, the measurements within step 702 can be made using linear encoders (e.g., an absolute linear encoder and/or an incremental linear encoder) configured to read a corresponding optical or magnetic scale. Further, in an embodiment, measurements of the longitudinal position are made in a direction substantially parallel to an optical axis of the optical device; measurements of the lateral position of the optical element are made in a direction substantially perpendicular to an optical axis of the optical device; and measurements of the rotation of the optical elements are made relative to any axis substantially perpendicular to the optical axis.

A control signal is then generated in step 704 based at least the measurements of the longitudinal position, lateral position, and rotation of the optical element obtained in step 702. In step 706, and in response to the generated control signal, a combination of a first force and a second force is applied to at least one elongated surface of one of a plurality of elongated structures that respectively support the optical element within the optical device. Subsequently, in step 708, the applied combination of the first and second forces is used to adjust one or more of a longitudinal position, a lateral position, or a rotation of the optical element within the optical device.

In an embodiment, the first force can be applied in a direction substantially perpendicular to the elongated surface, and the second force can be applied in a direction substantially parallel to the elongated surface. Further, in an embodiment, the combination of the first and second forces can be applied sequentially, individual, or in any cyclic combination thereof without departing from the spirit or scope of the present invention.

In an embodiment, steps 706 and 708 may be performed by piezoelectric actuator module (e.g., piezoelectric actuator module 220 of FIG. 2) having one or more piezoelectric elements (e.g., piezoelectric elements 222 and 224 of FIG. 2) that engage corresponding elongated surfaces of an elongated support structure (e.g., elongated surfaces 252 and 254 of elongated support structure 250 of FIG. 2). In such an embodiment, the control signal may be generated in step 704 by a control module, such as projection system controller PSC of FIG. 1A. However, in additional embodiments, steps 706 and step 708 may be performed by any additional actuator module or combination of actuator modules (e.g., mechanical actuators and linear motors) without departing from the spirit or scope of the present invention.

In the above-described embodiments, a positioning system, such as exemplary system 200 of FIG. 2, is used to position one or more optical elements within an optical device of a projection system, including, but not limited to an variable-zoom lens assembly housing one or more densely-packed lens elements. However, the present invention is not limited to positioning systems used in conjunction with projection systems, and in additional embodiments, positioning systems of the present invention may be incorporated into any number of optical systems without departing from the spirit or scope of the present invention. For example, a positioning system, such as described above with reference to FIG. 2, can be used in conjunction with optical systems that form optical images directly or that indirectly gather patterns of light, including, but not limited to, those that form optical images through the scattering of light from an illuminated surface according to the various properties of that illuminated surface.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system for positioning an optical element within an optical device, comprising:
   a frame configured to support the optical element;
   one or more elongated support structures, wherein each of the one or more elongated support structures comprises at least one elongated surface configured to support the frame;
   a controller configured to supply a control signal; and
   one or more actuator modules, wherein each of the one or more actuator modules is supported by the frame and configured to engage a respective one of the one or more elongated support structures, each of the one or more actuator modules comprises at least one piezoelectric element, each piezoelectric element comprising:
      a first portion configured to, upon receiving the control signal, extend in a first direction and to exert a first force at a first position on an elongated surface of a respective elongated support structure, the first direction being perpendicular to the elongated surface; and
      a second portion configured to, upon receiving the control signal, to extend in the first direction and a second direction and to exert a second force at a second position on the elongated surface, the second direction being parallel to the elongated surface;
      wherein, to advance the respective actuator module, the first portion is configured to retract in the first direction to release the first force and the second portion configured to, while exerting the second force at the second position on the elongated surface, retract in the second direction.

2. The system of claim 1, wherein each of the one or more elongated support structures has one of a prismatic cross section, a cylindrical cross section, or a semi-cylindrical cross section.

3. The system of claim 1, wherein each of the one or more elongated support structures has a triangular cross section.

4. The system of claim 1, wherein:
   the one or more elongated support structures comprises three elongated support structures; and
   an elongated axis of each of the three elongated support structures is substantially parallel to an optical axis of the optical device.

5. The system of claim 1, wherein the at least one piezoelectric element of each activated one of the one or more actuator modules sequentially applies the first and second forces to the at least one elongated surface of the respective one of the one or more elongated support structures.

6. The system of claim 1, wherein the at least one piezoelectric element of each activated one of the one or more actuator modules applies an identical combination of the first and second forces to the at least one elongated surface of the respective one of the one or more elongated support structures.

7. The system of claim 1, wherein:
   the frame comprises a linear encoder configured to measure a position of the frame along a corresponding one or the elongated support structures; and
   the control signal provided to each of the one or more actuator modules is based on measurements made by the linear encoder module.

8. The system of claim 1, further comprising:
   one or more additional frames respectively configured to support a corresponding additional optical element, wherein each of the one or more additional frames is supported by the one or more elongated support structures; and
   one or more additional actuator modules, wherein each of the one or more additional actuator modules is supported by a respective one of the one or more additional frames and configured to engage a respective one of the elongated support.

9. The system of claim 1, wherein the controller supplies an identical respective one of the control signal to each of the one or more actuator modules.

10. The system of claim 1, wherein the optical element is a lens element and the optical device is a set of telescoping zoom optics.

11. A lithographic apparatus, comprising:
   a support structure configured to support a pattern device that is configured to pattern a beam of radiation from an illumination system;
   a projection system configured to project the patterned beam towards a substrate support configured to support a substrate, the projection system comprising a system for positioning an optical element, the system comprising:
      a frame configured to support the optical element;
      one or more elongated support structures, wherein each of the one or more elongated support structures comprises at least one elongated surface configured to support the frame;
      a controller configured to supply a control signal; and
      one or more actuator modules, wherein each of the one or more actuator modules is completely supported by the frame and configured to engage a respective one of the one or more elongated support structures, each of the one or more actuator modules comprises at least one piezoelectric element, each piezoelectric element comprising:
         a first portion configured to, upon receiving the control signal, extend in a first direction and to exert a first force at a first position on an elongated surface of a respective elongated support structure, the first direction being perpendicular to the elongated surface; and
         a second portion configured to, upon receiving the control signal, to extend in the first direction and a second direction and to exert a second force at a second position on the elongated surface, the second direction being parallel to the elongated surface;
         wherein, to advance the respective actuator module, the first portion is configured to retract in the first direction to release the first force and the second portion is configured to, while exerting the second force at the second position on the elongated surface, retract in the second direction.

12. The lithographic apparatus of claim 11, wherein each of the one or more elongated support structures has one of a prismatic cross section, a cylindrical cross section, or a semi-cylindrical cross section.

13. The lithographic apparatus of claim 11, wherein each of the one or more elongated support structures has a triangular cross section.

14. The lithographic apparatus of claim 11, wherein the at least one piezoelectric element of each activated one of the one or more actuator modules sequentially applies the first and second forces to the at least one elongated surface of the respective one of the one or more elongated support structures.

15. The lithographic apparatus of claim 11, wherein the at least one piezoelectric element of each activated one of the one or more actuator modules applies an identical combination of the first and second forces to the at least one elongated surface of the respective one of the one or more elongated support structures.

16. The lithographic apparatus of claim 11, wherein:
the frame comprises a linear encoder configured to measure a position of the frame along a corresponding one or the elongated support structures; and
the control signal provided to each of the one or more actuator modules is based on measurements made by the linear encoder module.

17. The lithographic apparatus of claim 11, further comprising:
one or more additional frames respectively configured to support a corresponding additional optical element, wherein each of the one or more additional frames is supported by the one or more elongated support structures; and
one or more additional actuator modules, wherein each of the one or more additional actuator modules is supported by a respective one of the one or more additional frames and configured to engage a respective one of the elongated support.

18. The lithographic apparatus of claim 11, wherein the controller supplies an identical respective one of the control signal to each of the one or more actuator modules.

19. The lithographic apparatus of claim 11, wherein the optical element is a lens element and the optical device is a set of telescoping zoom optics.

20. A method for positioning an optical element within an optical device, comprising:
measuring one or more of a longitudinal position of the optical element, a lateral position of the optical element, and a rotation of the optical element;
in response to the measured one or more of the longitudinal position, lateral position, and rotation, the plurality of elongated support structures being configured to support the optical element within the optical device,
extending a first portion of the piezoelectric element in a first direction to exert a first force at a first position on a surface of a respective elongated support structure, the first direction being perpendicular to the surface;
extending a second portion of the piezoelectric element in the first direction and a second direction to exert a second force at a second position on the surface, the second direction being parallel to the surface;
retracting the first portion in the first direction to release the first force; and
while exerting the second force at the second position, retracting the second portion in the second direction.

21. The method of claim 20, further comprising:
generating a control signal based on the measured longitudinal position, lateral position, and rotation; and
applying a combination of a first force and a second force to the at least one elongated surface based on at least the generated control signal.

22. The method of claim 20, wherein the measuring step comprises:
measuring the longitudinal position of the optical element in a direction substantially parallel to an optical axis of the optical device;
measuring the lateral position of the optical element in a direction substantially perpendicular to the optical axis of the optical device; and
measuring the rotation of the optical device about any axis substantially perpendicular to the optical axis of the optical device.

* * * * *